(12) United States Patent
Torok

(10) Patent No.: US 10,932,394 B2
(45) Date of Patent: Feb. 23, 2021

(54) ELECTRONICS HOUSING WITH HEAT SINK

(71) Applicant: PARKER-HANNIFIN CORPORATION, Cleveland, OH (US)

(72) Inventor: Peter Z. Torok, Brockport, NY (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 16/640,410

(22) PCT Filed: Oct. 3, 2018

(86) PCT No.: PCT/US2018/054113
§ 371 (c)(1),
(2) Date: Feb. 20, 2020

(87) PCT Pub. No.: WO2019/070815
PCT Pub. Date: Apr. 11, 2019

(65) Prior Publication Data
US 2020/0253087 A1 Aug. 6, 2020

Related U.S. Application Data

(60) Provisional application No. 62/567,827, filed on Oct. 4, 2017.

(51) Int. Cl.
*H05K 7/20* (2006.01)
*H05K 5/06* (2006.01)
(52) U.S. Cl.
CPC ......... *H05K 7/20418* (2013.01); *H05K 5/069* (2013.01); *H05K 7/20854* (2013.01)

(58) Field of Classification Search
CPC ..... F28F 9/26; H05K 1/0203; H05K 2201/06; H05K 2201/066; H05K 5/0034;
(Continued)

(56) References Cited

U.S. PATENT DOCUMENTS 6,084,178 A * 7/2000 Cromwell ............... H01L 23/32
174/16.3
2006/0181859 A1 8/2006 Thorum
(Continued)

FOREIGN PATENT DOCUMENTS

CN 106793675 A 5/2017

OTHER PUBLICATIONS

PCT/US2018/054113; PCT International Search Report and Written Opinion of the International Searching Authority dated Jan. 8, 2019.
(Continued)

*Primary Examiner* — Mandeep S Buttar
(74) *Attorney, Agent, or Firm* — Renner, Otto, Boisselle & Sklar, LLP

(57) ABSTRACT

An electronic housing assembly includes a polymeric housing base and a metallic heat sink secured to the housing base with a snap-fit engagement. A printed circuit board is positioned within a cavity in the housing assembly and is protected within the housing by an environmental seal. The electronic housing assembly allows for expansion and contraction between the heat sink and the housing while maintaining the integrity of the seal.

20 Claims, 11 Drawing Sheets

(58) Field of Classification Search
CPC .... H05K 5/0204; H05K 7/1474; H05K 5/069;
H05K 7/20418; H05K 7/20854
USPC ........................................ 361/704, 715, 720
See application file for complete search history.

(56) References Cited

U.S. PATENT DOCUMENTS

2009/0109627 A1    4/2009  Murr et al.
2018/0228065 A1    8/2018  Inrona et al.

OTHER PUBLICATIONS

PCT/US2018/054113; PCT International Preliminary Report on Patentability dated Apr. 8, 2020.

\* cited by examiner

ELECTRONICS HOUSING WITH HEAT SINK

This application is a national phase of International Application No. PCT/US2018/054113 filed on Oct. 3, 2018 and published in the English language, and claims priority to U.S. Provisional Application No. 62/567,827 filed on Oct. 4, 2017, which are incorporated herein by reference.

FIELD OF INVENTION

The present invention relates to a housing assembly that includes a heat sink for dissipating or transferring heat from electronics secured within the housing.

BACKGROUND

Automotive sensors measure, monitor and control various data in order to maintain proper vehicle operation and enhance safety. Enhanced safety features include blind spot detection, lane change assistance, adaptive cruise control, lane departure warning, brake assistance and collision avoidance, parking assistance, and the like. The electronic sensor units are typically subjected to extremely harsh conditions, such as heat, moisture and vibration.

Conventional vehicle electronic sensor units have a plastic or metal housing, a printed circuit board (PCB) within the housing, a heat sink plate, and a connector that connects to the vehicle wire harness. The heat sink plate is mounted to the PCB for drawing away heat generated by the PCB during vehicle operation.

As the number of sensors employed in automotive vehicle operation increases, so does the power requirement of the individual sensors. As a result, there is a need for enhanced heat sinking for the sensor units.

SUMMARY

The present description is directed to an electrical housing assembly that, in a first aspect, includes a housing base having a first opening and an opposing second opening, a recessed flange circumscribing the first opening, and a plurality of resilient retention members surrounding the flange; an annular retainer having a plurality of bores corresponding to the plurality of resilient retention members for receiving the plurality of resilient retention members; and a heat sink positioned over the first opening and having a lip disposed about the periphery of the heat sink, the lip retained between the retainer and the flange of the housing base in an engaged state.

In one embodiment, the housing base is a polymeric material and the heat sink is constructed a metallic material, such as aluminum.

An environmental seal member is positioned on the heat sink lip, with the environmental seal compressed between the lip and the flange in an engaged state.

Each resilient retention member on the housing base includes an outwardly facing barb at a distal end. The resilient members move outwardly from an initial position in response to a snap-in insertion force exerted against the retainer and returning to the initial position after the retainer ring is in abutting contact with the housing base and heat sink lip.

An elastomeric gasket may be applied to an inner rim of the heat sink. In one embodiment, the elastomeric gasket is electrically conductive.

The heat sink may include a plurality of spaced apart cooling fins arranged on an outwardly facing surface of the heat sink. The heat sink may also include at least one raised thermal pad at an inwardly facing surface of the heat sink. A thermal interface material (TIM) may be applied to the at least one thermal pad.

In another aspect, there is provided an electrical housing assembly that includes a housing base having a first opening and an opposing second opening, a recessed flange circumscribing the first opening, and a plurality of resilient retention members surrounding the flange; and a heat sink positioned over the first opening and having a lip disposed about the periphery of the heat sink, and a shoulder disposed radially inward from the lip, the lip having a plurality of bores corresponding to the plurality of resilient retention members for receiving the plurality of resilient retention members therein, wherein the shoulder engages the flange of the housing base in a secured state.

In another aspect, there is provided an electrical housing assembly that includes a housing base having a first opening and an opposing second opening, a recessed flange circumscribing the first opening, and a plurality of bores surrounding the flange; and a heat sink positioned over the first opening and having a lip disposed about the periphery of the heat sink and a shoulder disposed radially inward from the lip, the lip having a plurality of resilient retention members; and wherein the plurality of bores of the housing base is arranged for receiving the plurality of resilient retention members of the heat sink therein, and wherein the shoulder of the heat sink engages the flange of the housing base in a secured state.

DETAILED DESCRIPTION

The housing assembly described herein is configured to transfer heat from electronics, e.g., a printed circuit board (PCB), secured within the housing while providing an improved environmental seal.

Figure 1:
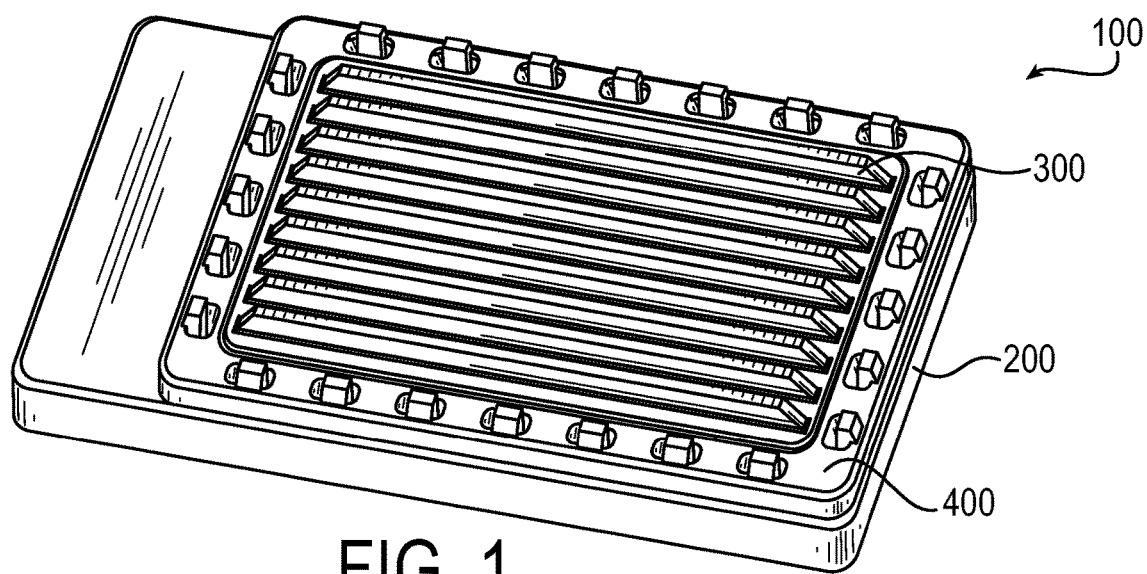
FIG. 1 is a perspective view of an exemplary housing assembly in accordance with the present invention.

Referring to FIG. 1, an exemplary housing assembly 100 includes a base 200, a heat sink 300 and a retainer 400 snap-fit to the base 200 to secure the heat sink 300 in place.

Figure 2:
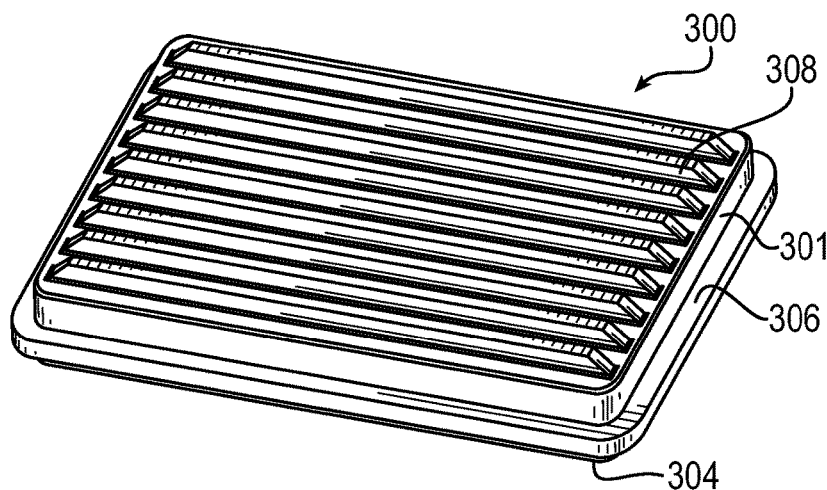
FIG. 2 is a perspective view of the top surface of an exemplary heat sink of the housing assembly of FIG. 1.
Figure 3:
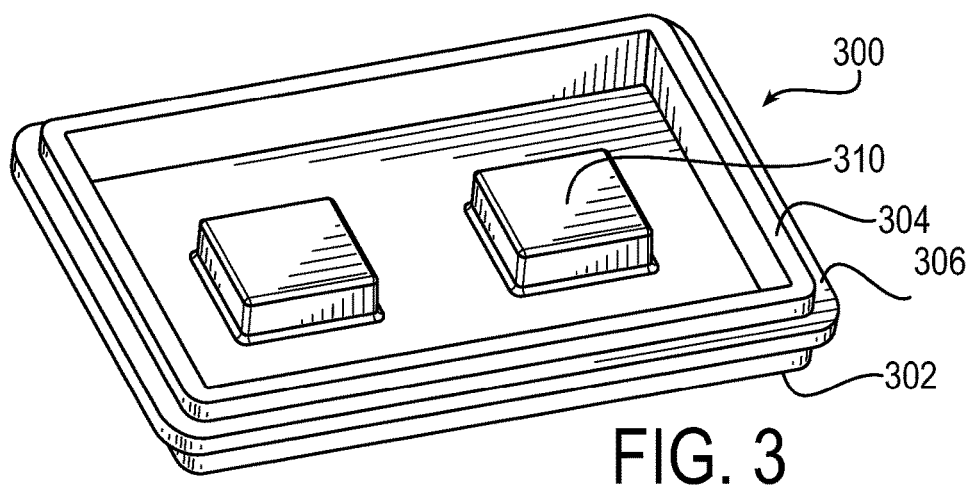
FIG. 3 is a perspective view of the bottom surface of the heat sink of FIG. 2.

FIGS. 2 and 3 show an exemplary heat sink 300. The heat sink 300 has a plate body 301, which defines a top surface 302, a bottom surface 304 and an annular lip 306. A plurality of fins 308 are formed in the top surface 302 and extend outwardly from the plate body 301. The fins 308 are parallel and spaced apart along the length of the plate body 301. The fins 308 are formed integrally with the plate body 301. The bottom surface 304 includes one or more thermal pads 310 for cooling electronic components mounted to the PCB (not shown).

Heat sink 300 may be a metal heat sink. The metal may be, but not limited to, aluminum, copper, alloys and the like. The selection of the metal can provide electromagnetic interference (EMI) shielding in addition to heat transfer. The heat sink 300 may be manufactured using a variety of techniques, including but not limited to, metal stamping, die casting, extrusion, powder metal and injection molding. In one embodiment, the heat sink in made of die cast aluminum.

Figure 4:
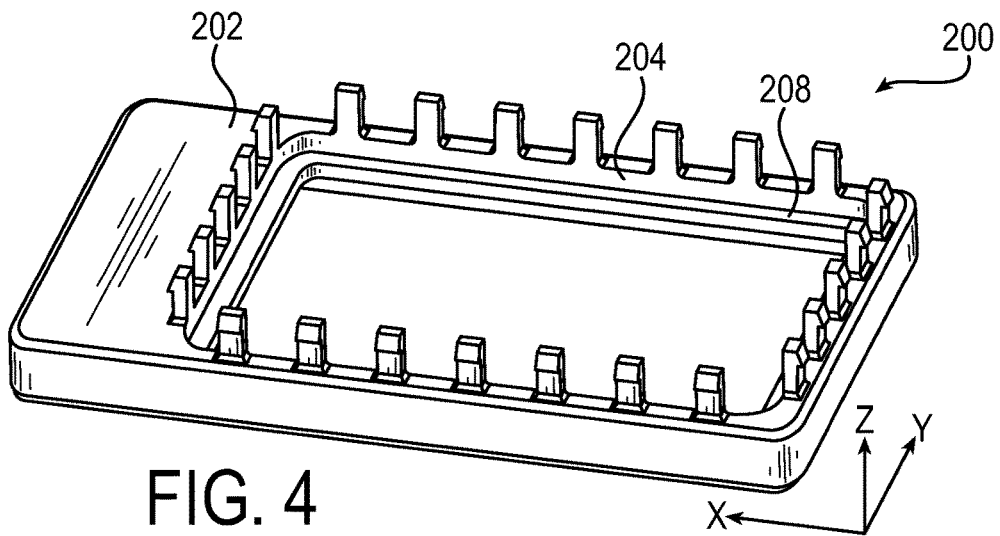
FIG. 4 is a perspective view of the base of the housing assembly of FIG. 1.
Figure 5:
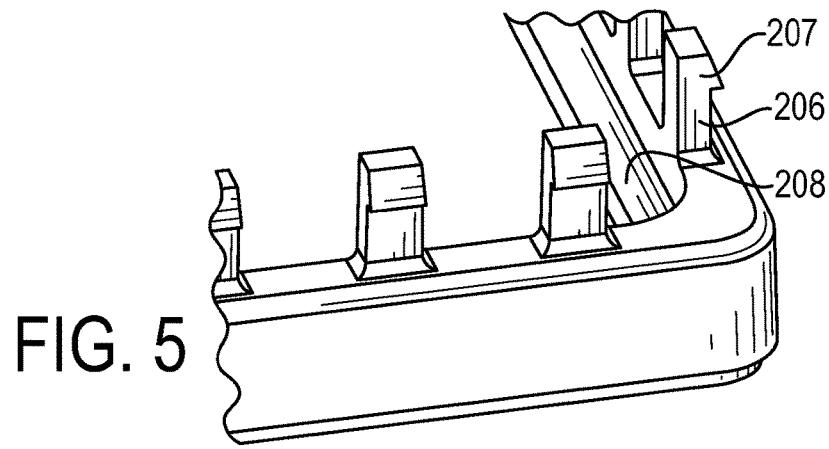
FIG. 5 is a partial, close-up view of the tabs of the base of FIG. 4.

Referring to FIGS. 4 and 5, housing base 200 is generally rectangularly shaped and has a top surface 202 that includes a recessed opening 204 and a plurality of resilient tabs 206 surrounding recessed opening 204. Tabs 206 are integrally formed on the top surface 203 and extend upwardly (in the z direction) from the horizontal (x-y) plane of the recessed opening 204. Each tab 206 has a barb 207 at the distal end, the barb 207 facing away from the recessed opening 204. An annular flange 208 surrounding recessed opening 204. The dimensions of the recessed opening 204 and annular flange 208 correspond to the heat sink 300.

Generally, the housing base will include a connection element (not shown) that cooperates with the PCB (not shown) and a corresponding external connector, for example, a vehicle wire harness (not shown).

Figure 6:
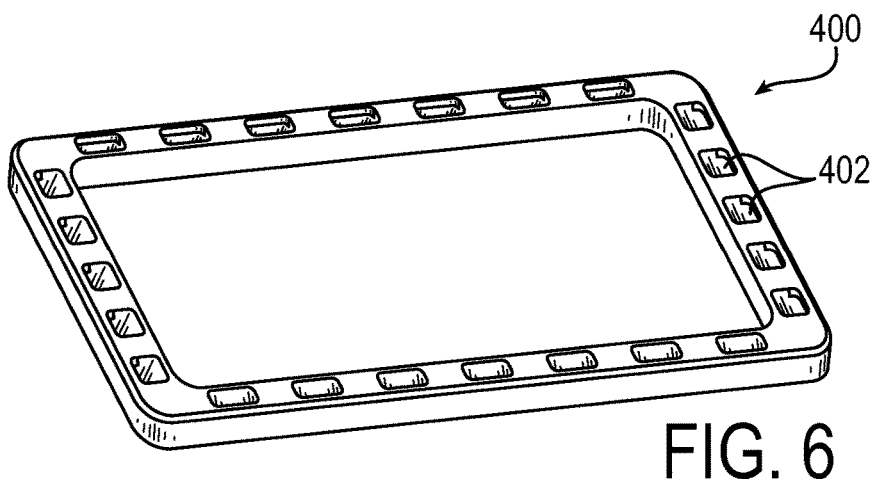
FIG. 6 is a perspective view of the retainer of the housing assembly of FIG. 1.
Figure 7:
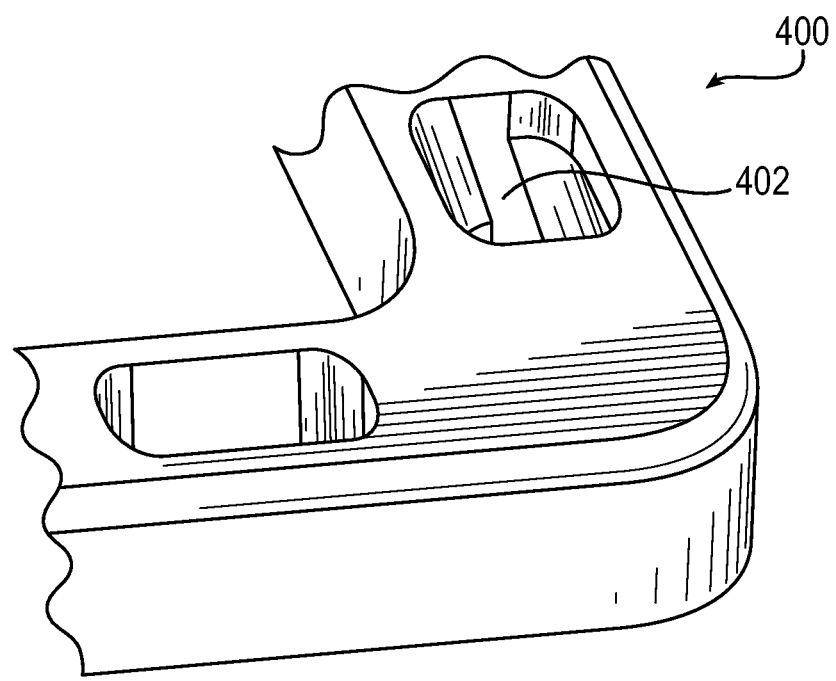
FIG. 7 is a partial, close-up view of the bores in the retainer of FIG. 6.
Figure 8:
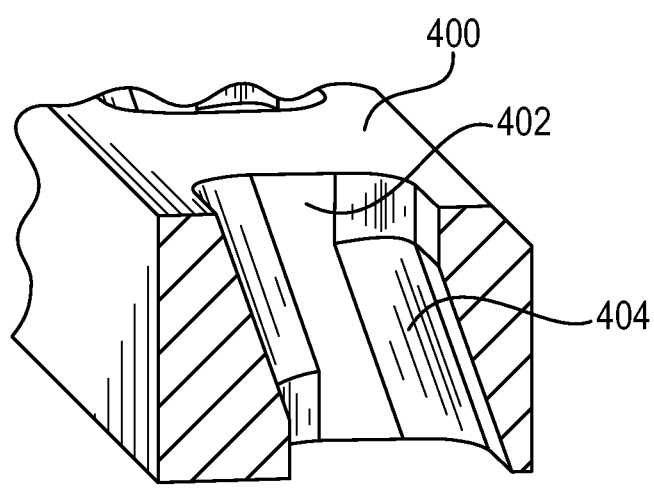
FIG. 8 is a cross-sectional view of the retainer of FIG. 6 showing the interior of a bore.

Referring to FIGS. 6 and 7, retainer 400 is used to secure heat sink 300 to base 200 in the housing assembly. Annular retainer 400 includes a plurality of bores 402 that correspond to the plurality of tabs 206 on base 200. The bores 402 are shown as having a rectangular shape, but may be of any shape that accommodates the base tabs 206 and barbs 207 thereon. As shown in FIG. 8, the interior surfaces of the bores 402 may be configured to include features, such as one or more sloped side walls 404, that facilitate flexing of the tabs 206 during installation of the heat sink.

The annular retainer 400 provides a high concentration of snap features around the entire perimeter of the heat sink 300. In addition, assembly time is very efficient by use of a simple application of pressure. The annular retainer 400 may be manufactured by injection molding.

Housing base 200 and retainer 400 are constructed of a polymeric material, which may be a blend or other admixture, may be a thermoplastic or thermoset, and specifically may be selected as depending upon one or more of operating temperature, hardness, chemical compatibility, resiliency, compliancy, compression-deflection, compression set, flexibility, ability to recover after deformation, modulus, tensile strength, elongation, force defection, flammability, or other chemical or physical property. Depending upon the application, suitable materials may include, particularly, polyurethanes, silicones, fluorosilicones, polycarbonates, ethylene vinyl acetates (EVA), acrylonitrile-butadiene-styrenes (ABS), polysulfones, acrylics, polyvinyl chlorides (PVC), polyphenylene ethers, polystyrenes, polyamides, nylons, polyolefins, poly(ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes (SIS), styrene-butadiene-styrenes (SBS), ethylene-propylenes (EPR), ethylene-propylene-diene monomers (EPDM), nitrile-butadienes (NBR), and styrene-butadienes (SBR), and copolymers and blends thereof. Any of the forgoing materials may be used unfoamed or, if required by the application, blown or otherwise chemically or physically processed into an open or closed cell foam.

In some embodiments, the base and retainer component of the housing may have EMI shielding properties. For these embodiments, the base and retainer may include a blend or other admixture of a resin, plastic, elastomeric, or other or other polymeric component, and an electrically-conductive, particulate filler component.

The polymeric component generally may form a binder or other continuous or matrix phase within the material into which the electrically-conductive particulate filler may be dispersed as a discrete phase. The filler generally is included within the binder in a proportion sufficient to provide the level of electrical conductivity which is desired for the intended application. For most applications, a bulk or volume resistivity of not greater than about 1,000 $\Omega$-cm, and/or a surface resistance of not greater than about 1000 $\Omega$/sq., would be considered acceptable, and would translate to a filler loading which generally may be between about 5-95% by weight, based on the total volume or weight, as the case may be, of the compound.

In general, the filler may be of any shape, or combination of shapes, and is referred broadly herein as being "particulate," which should be understood to include solid or hollow spheres and microspheres, elastomeric balloons, flakes, platelets, fibers, rods, irregularly-shaped particles, fibers, which may be chopped or milled or whiskers, and powders. For many applications, the particle size or distribution of the filler, which may be a diameter, imputed diameter, length, or other dimension of the particulate typically will range from about 0.01 mil (0.25 µm) to about 10 mils (250 µm) for powders, and from about 0.004 inch (0.1 mm) to about 1 inch (25 mm) for fibers.

Suitable electrically-conductive fillers include: nonmetals such as carbon, graphite, and inherently, i.e., intrinsically, conductive polymers; noble and non-noble metals such as gold, silver, nickel, copper, tin, aluminum, and nickel; noble or non-noble metal-plated, clad, metallized, or otherwise coated noble and non-noble metals such as gold or silver-plated copper, nickel, or aluminum, and tin or nickel-plated copper, silver, bismuth, indium, and lead; noble or non-noble metal coated non-metals such as gold, silver and/or nickel-plated or clad graphite, i.e., gold plated nickel clad graphite, glass, ceramics, plastics, elastomers, and mica; non-metal coated metal and non-metals; and combinations and mixtures thereof. The electrically-conductive filler specifically may be selected as depending upon one or more of conductivity, resin demand, hardness, chemical compatibility, such as with the polymeric component, and cost. In the case of a coating, the coating may be formed of one or more layers of the same material, or of layers of different materials.

Additional fillers and additives may be included in the formulation of the material depending upon the requirements of the particular application envisioned. Such fillers and additives, which may be functional or inert, may include wetting agents or surfactants, pigments, dispersants, dyes, and other colorants, opacifying agents, foaming or anti-foaming agents, anti-static agents, coupling agents such as titanates, chain extending oils, tackifiers, flow modifiers, pigments, lubricants such as molybdenum disulfide ($MoS_2$), silanes, peroxides, film-reinforcing polymers and other agents, stabilizers, emulsifiers, antioxidants, thickeners, and/or flame retardants and other fillers such as aluminum trihydrate, antimony trioxide, metal oxides and salts, intercalated graphite particles, phosphate esters, decabromodiphenyl oxide, borates, phosphates, halogenated compounds, glass, silica, which may be fumed or crystalline, silicates, mica, ceramics, and glass or polymeric microspheres. Typically, these fillers and additives are blended or otherwise admixed with the formulation or with the polymer component thereof, and may comprise between about 0.05-80% or more by total volume of the formulation.

Figure 9:
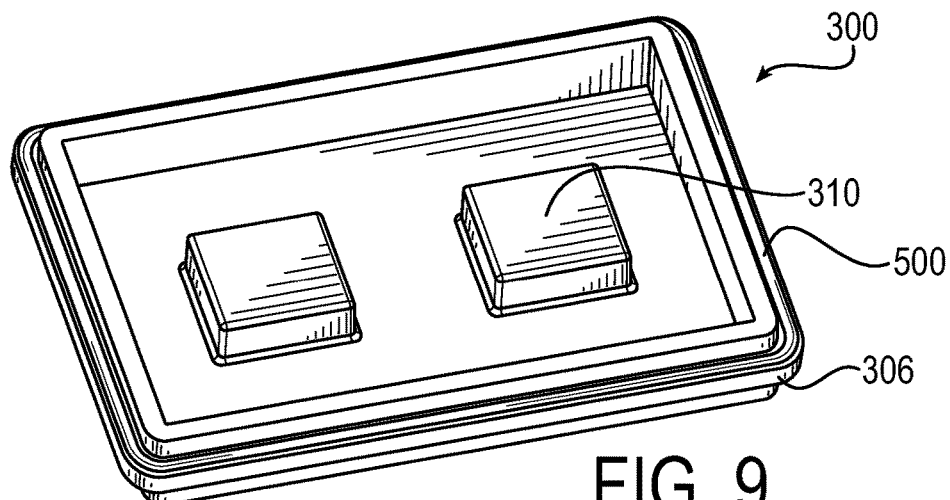
FIG. 9 is a partial perspective view of the heat sink of FIG. 2 with an environmental seal at the interface of the heat sink and the housing base.
Figure 10:
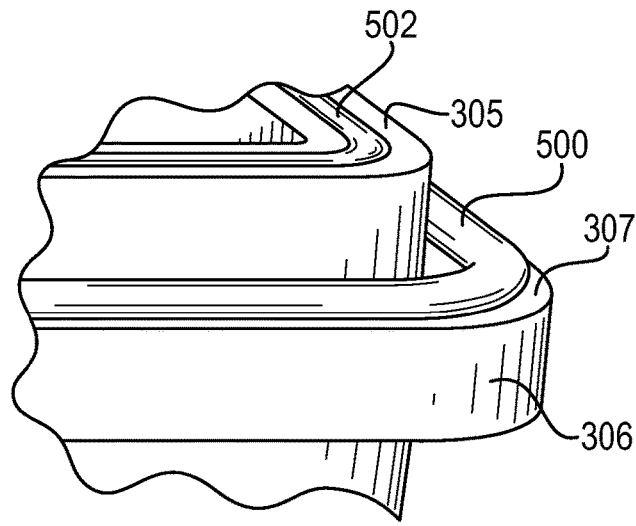
FIG. 10 is a partial, close-up view of the environmental seal of FIG. 9.

Referring to FIGS. 9 and 10, prior to installation of heat sink 300 into the base 200, an environmental seal 500 is applied to the bottom side 307 of lip 306. Environmental seal 500 may be a pre-formed gasket or a dispensed elastomeric material that is applied to the entire annular lip 306. In one embodiment, the environmental seal includes a silicone based gel.

Figure 11:
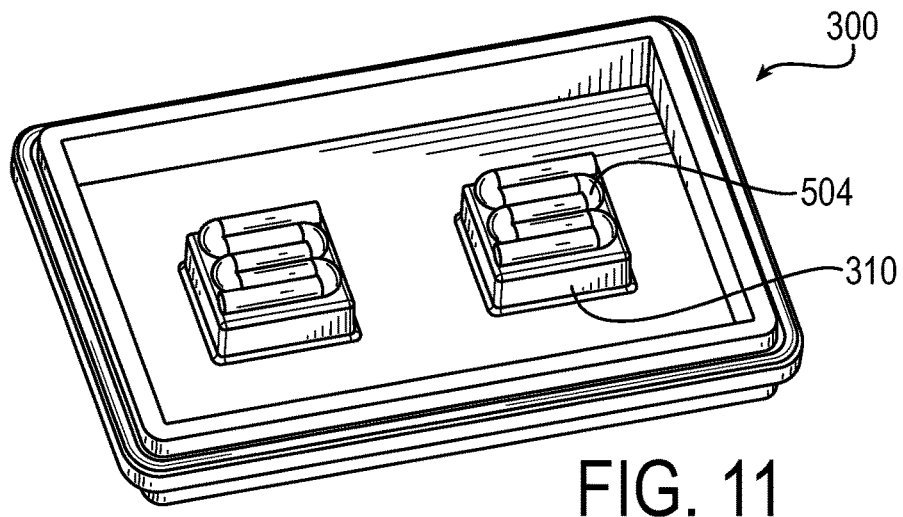
FIG. 11 is a perspective view of the heat sink of FIG. 3 with a TIM applied to the thermal pads of the heat sink.

Referring to FIG. 11, a thermal interface material (TIM) 504 is applied to the surface of thermal pads 310 to facilitate heat transfer from the PCB (not shown) to the heat sink 300. The TIM may be, for example, a dispensed thermal paste or thermal gel. Alternatively, the TIM may be a pre-cut and pressure sensitive adhesive attached gap pad.

As illustrated in FIG. 10, an electrically conductive gasket 502 or gasket-like material may be applied to the bottom rim 305 of the heat sink. The electrically-conductive gasket or gasket-like material 502 may be provided in the form of a gasket having a resilient core element affording gap-filling capabilities, which core element may be loaded, sheathed, or coated with an electrically conductive element. The resilient core element, which may be foamed or unfoamed, solid or tubular, typically may be molded, extruded, die-cut, or otherwise formed of an elastomeric thermoplastic material such as a polyolefin, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as an over-molded or formed-in-place (FIP) bead of a curable, electrically-conductive silicone or urethane composition. As to an FIP construction, the composition may be dispensed in a fluent state onto one or the other of the surfaces, and then cured or foamed in situ via the application of heat or with atmospheric moisture, UV, radiation, or other energy sources.

Figure 12:
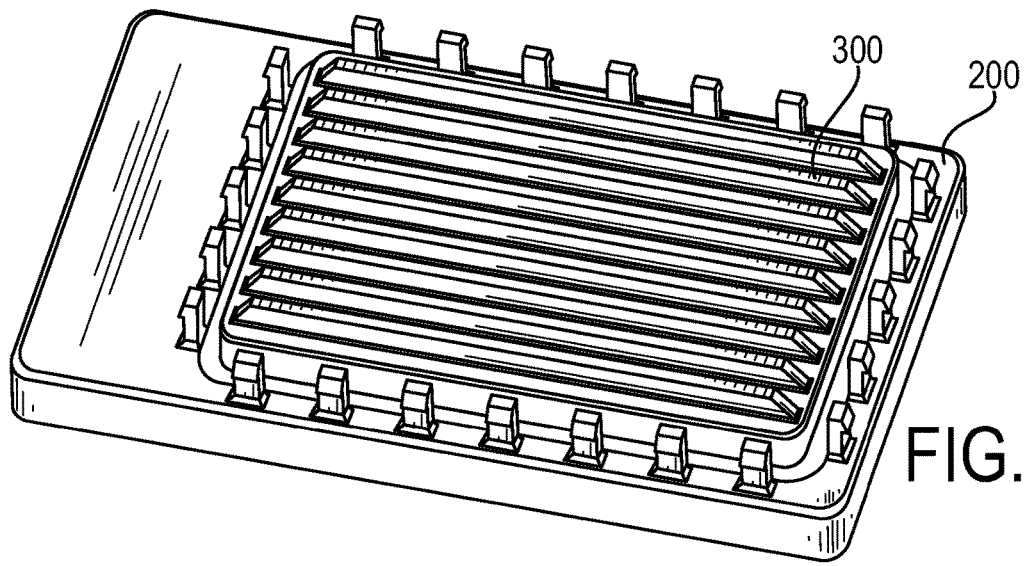
FIG. 12 is a perspective view of a heat sink and housing stack of the assembly of FIG. 1.
Figure 13:
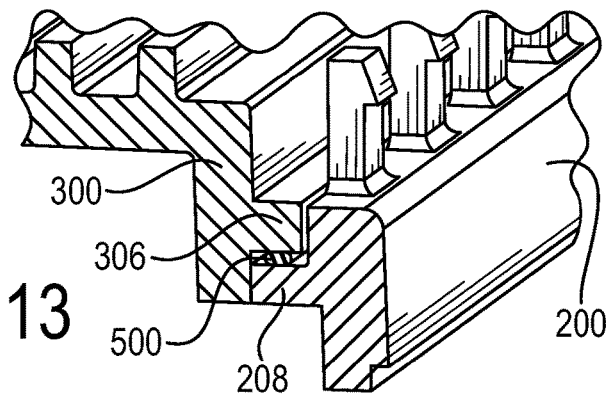
FIG. 13 is a partial cross-sectional view of the heat sink and housing stack of FIG. 12 with the environmental seal at the interface.

Referring to FIGS. 12 and 13, the heat sink 300 with pre-applied gasket 500 is nested into the recessed opening 204 of base 200. The length and width of the heat sink 300 have gap clearance with respect to the dimensions of the recessed opening 204. The lip 306 of the heat sink, with the environmental seal 500 applied thereto, engages the annular flange 208 of the base 200.

Figure 14:
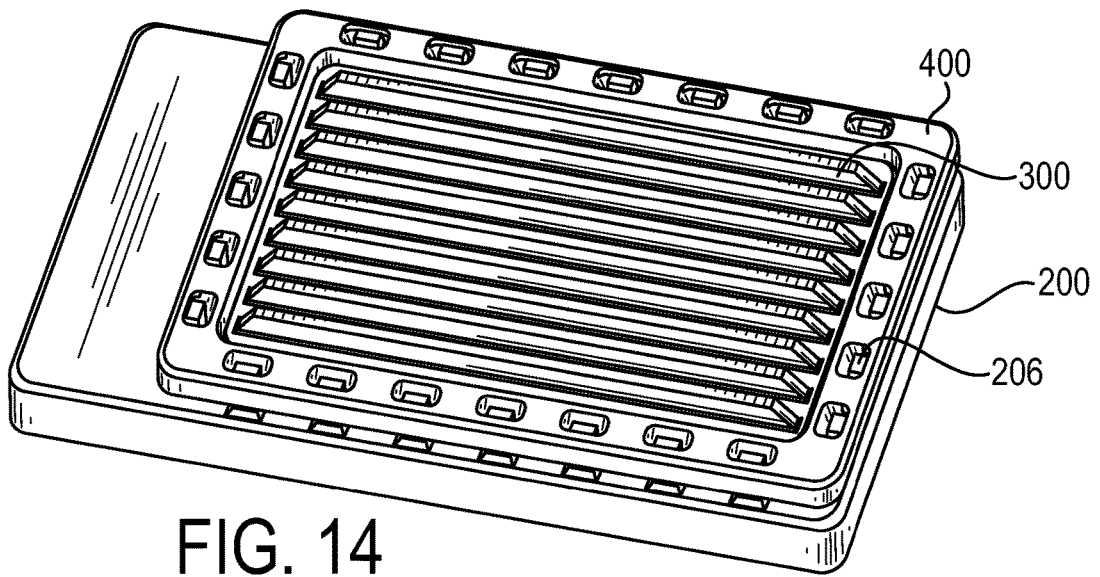
FIG. 14 is a perspective view of the heat sink and housing stack of FIG. 12 with the annular retainer in position for installation.
Figure 15:
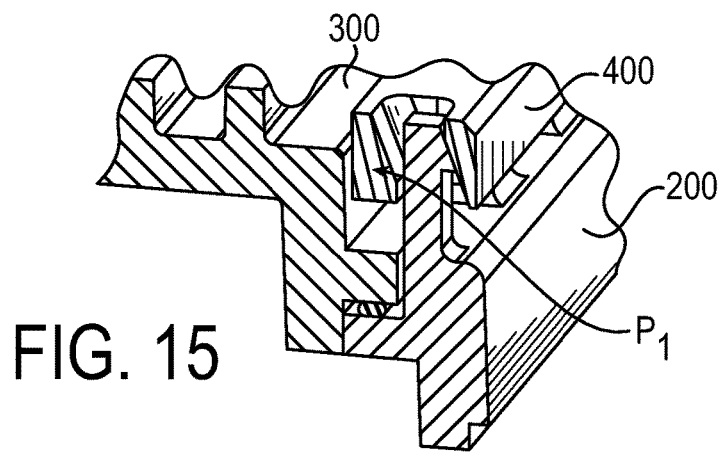
FIG. 15 is a partial cross-sectional view of the components of the housing assembly of FIG. 1 in a pre-assembled state.
Figure 16:
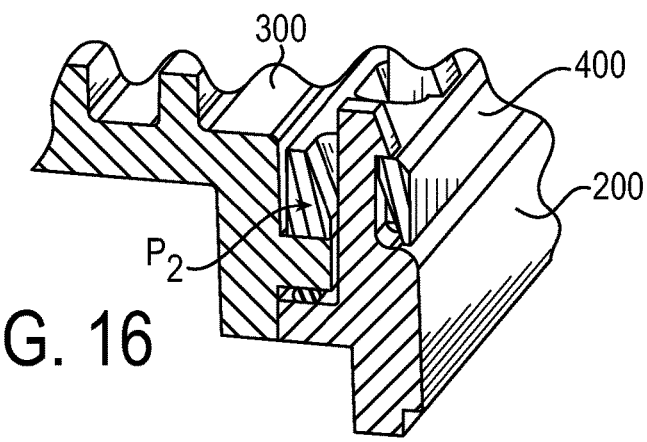
FIG. 16 is a partial cross-sectional view of the assembly of FIG. 15 with the retainer snap fit to the housing base.

Referring to FIGS. 14 to 16, once the heat sink 300 has been nested into the base 200, the retainer 400 is placed over the tabs 206 of base 200, aligning the bores 402 with the corresponding tabs 206. In the pre-assembled position $P_1$, tabs 206 flex inwardly away from an initial position in response to a snap-in insertion force being applied to the retainer 400. Once the retainer 400 is in abutting contact with the base 200 and heat sink lip 306, as shown in the assembled position $P_2$ in FIG. 16, the tabs 206 return to their initial position with the barbs 207 now being in gripping engagement with the upper surface of the retainer 400. In the snapped-in position, the retainer 400 compresses the environmental seal 500 between the heat sink lip 306 and annular flange 208. The snap features around the entire perimeter of the heat sink provides very uniform compression of the environmental seal.

Figure 17:
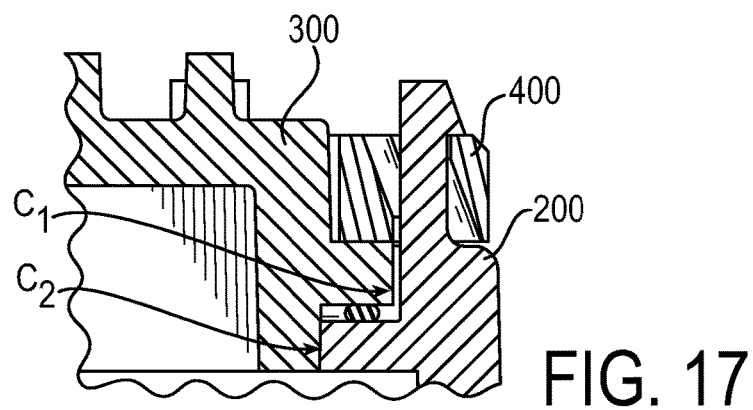
FIG. 17 is a partial cross-sectional view of the assembly of FIG. 16.

Referring to FIG. 17, the clearances ($c_1$ and $c_2$) built into the length and width dimensions of the heat sink 300 and base 200 allow for coefficient of thermal expansion (CTE) mismatch between the metal heat sink 300 and the plastic base 200 without cracking or seal separation failure.

Figure 18:
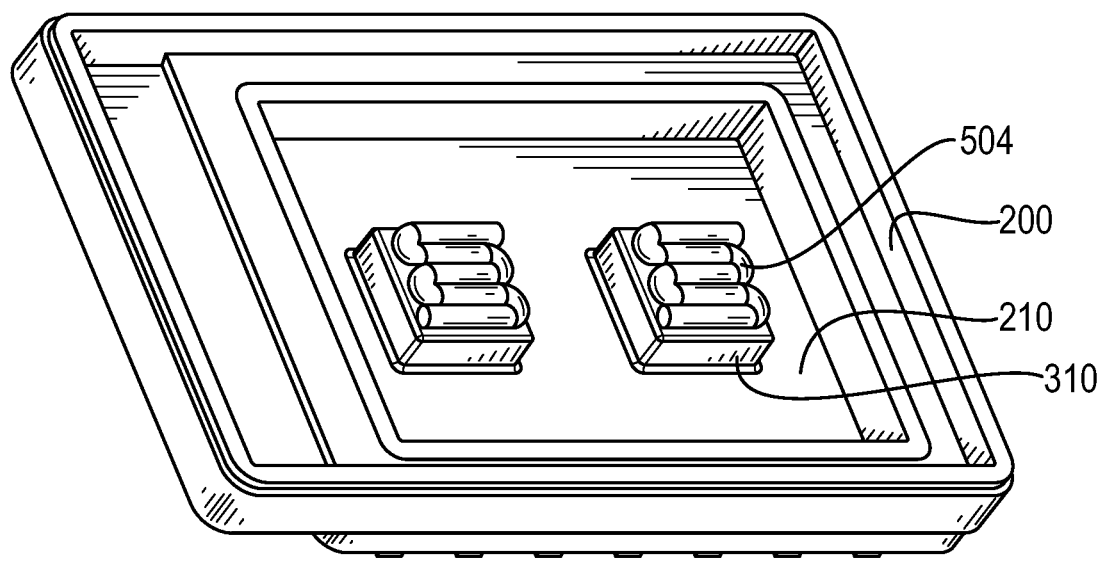
FIG. 18 is a perspective view of the underside of housing assembly of FIG. 16.

As shown in FIG. 18, the housing assembly 100 includes a receiving space 210 for receiving a PCB (not shown). The thermal pads 310 with the TIM 504 applied thereto are positioned to align with and contact heat generating components on the PCB for transferring heat from the heat generating components. The position and size of the thermal pads may be tailored to the particular features of the PCB to be housed within the housing assembly.

Figure 19:
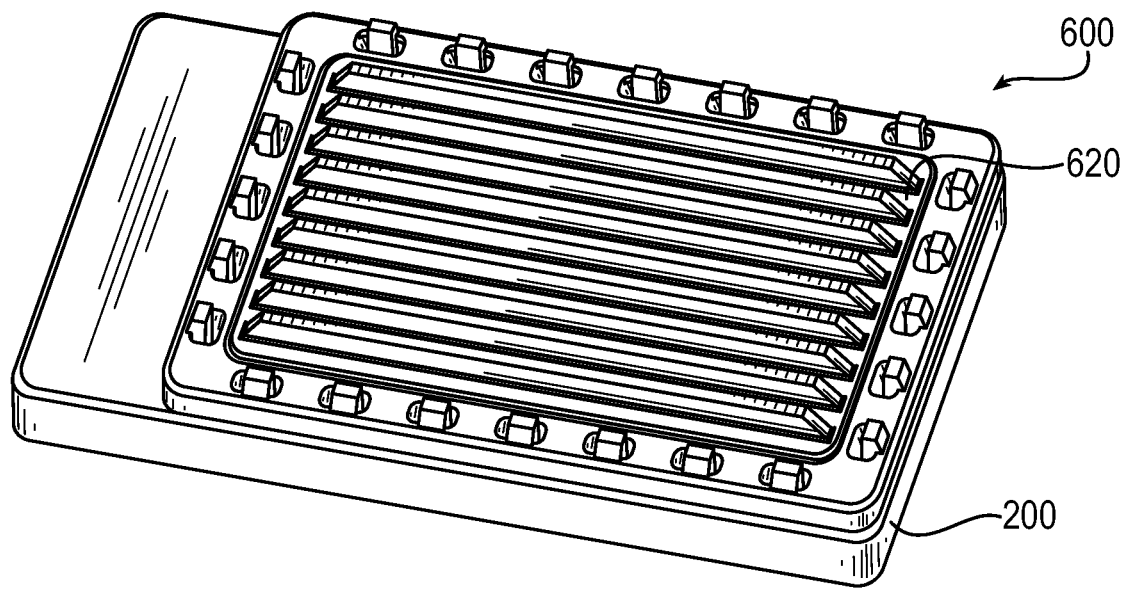
FIG. 19 is a perspective view of another exemplary housing assembly in accordance with the present invention.

Referring to FIG. 19, an alternative housing assembly 600 includes a base 200 and a heat sink 620 having retainer features to snap-fit the heat sink 620 to the base 200. Base 200 is described above and illustrated in FIGS. 4 and 5.

Figure 20:
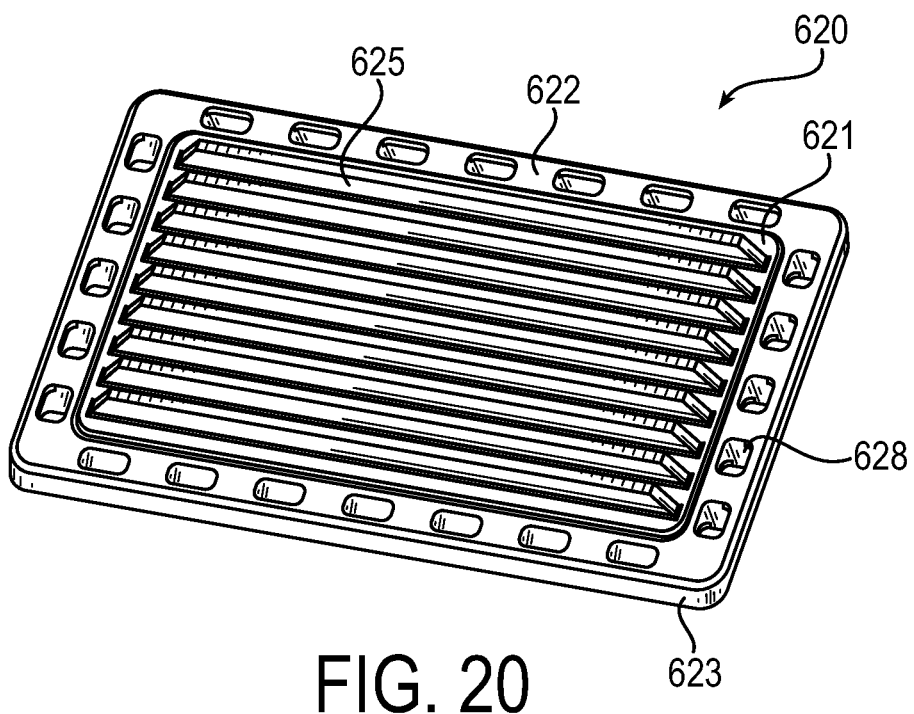
FIG. 20 is a perspective view of the top surface of the heat sink of the housing assembly of FIG. 19.
Figure 21:
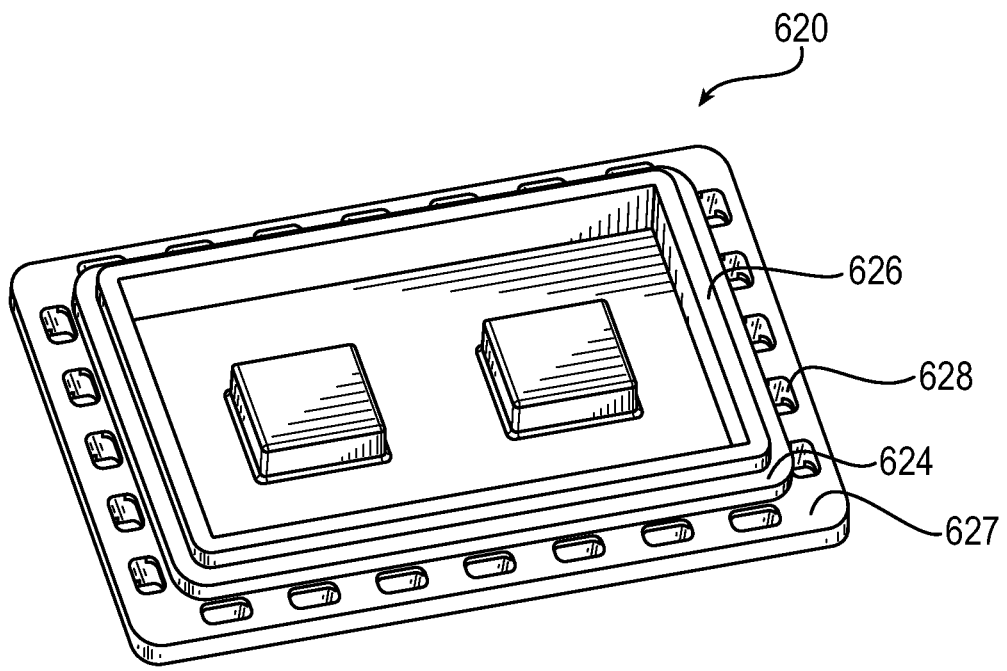
FIG. 21 is a perspective view of the bottom surface of the heat sink of FIG. 20.
Figure 22:
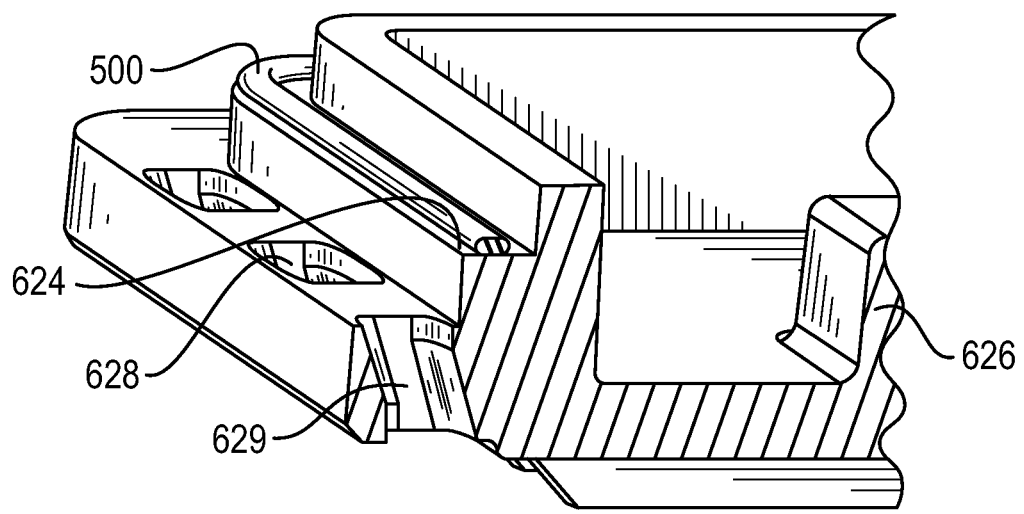
FIG. 22 is a partial cross-sectional view of the heat sink of FIG. 21.

FIGS. 20 and 21 show heat sink 620. The heat sink 620 has a plate body 621 which defines a top surface 622, a bottom surface 623 and an annular retainer lip 627. The annular retainer lip 627 includes a plurality of bores 628 that correspond to the plurality of tabs 206 on base 200. The bores 628 are shown as having a rectangular shape, but may be of any shape that accommodates the base tabs 206 and barbs 207 thereon. As shown in FIG. 22, the interior surfaces of the bores 628 may be configured to include features, such as one or more sloped side walls 629, that facilitate flexing of the tabs 206 during installation of the heat sink. A plurality of fins 625 are formed in the top surface 622 and extend outwardly from the plate body 621. The fins 625 are parallel and spaced apart along the length of the plate body 621. The fins 625 are formed integrally with the plate body 621. The bottom surface 623 includes shoulder 624 disposed radially inward from annular lip 627. The bottom surface includes one or more thermal pads 626 for cooling electronic components mounted to the PCB (not shown).

Heat sink 620 may be a metal heat sink. The metal may be, but not limited to, aluminum, copper, alloys and the like. The selection of the metal can provide electromagnetic interference (EMI) shielding in addition to heat transfer. The heat sink 620 may be manufactured using a variety of techniques, including but not limited to, metal stamping, die casting, extrusion, powder metal and injection molding. In one embodiment, the heat sink in made of die cast aluminum.

Referring to FIG. 22, prior to installation of heat sink 620 onto the base 200, an environmental seal 500 is applied to shoulder 624. Environmental seal 500 may be a pre-formed gasket or a dispensed elastomeric material that is applied to the entire shoulder 624. In one embodiment, the environmental seal includes a silicone based gel.

Figure 23:
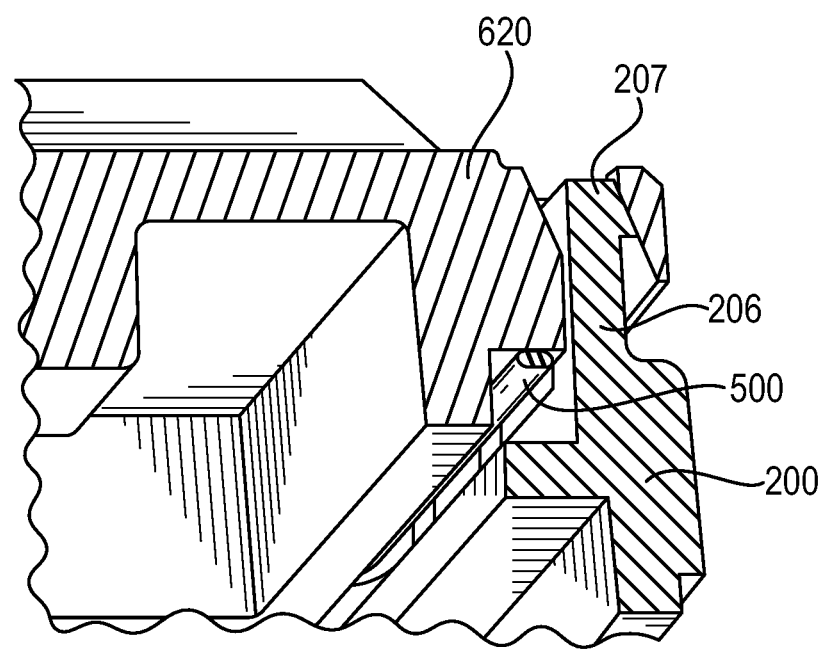
FIG. 23 is a partial cross-sectional view of the components of the housing assembly of FIG. 19 in a pre-assembled state.
Figure 24:
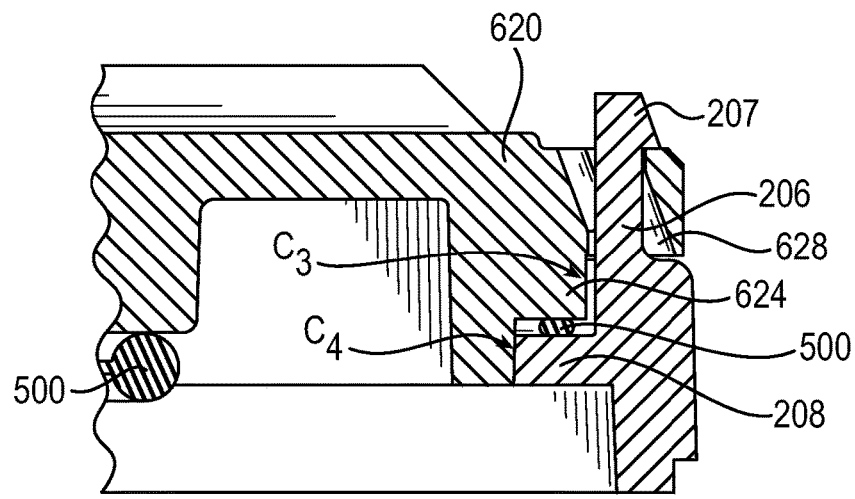
FIG. 24 is a partial cross-sectional view of the assembly of FIG. 19 with the heat sink snap fit to the housing base.

Referring to FIG. 23, the heat sink 620 with pre-applied gasket 500 is placed over the tabs 206 of base 200, aligning the bores 628 with the corresponding tabs 206. As shown in the assembled position in FIG. 24, the barbs 207 are in gripping engagement with the upper surface of the retaining lip 627. In the snapped-in or secured position, the environmental seal 500 is compressed between the shoulder 624 and annular flange 208 of base 200. The snap features around the entire perimeter of the heat sink provides very uniform compression of the environmental seal. The clearances ($c_3$ and $c_4$) built into the length and width dimensions of the heat sink 620 and base 200 allow for coefficient of thermal expansion (CTE) mismatch between the metal heat sink 620 and the plastic base 200 without cracking or seal separation failure.

Figure 25:
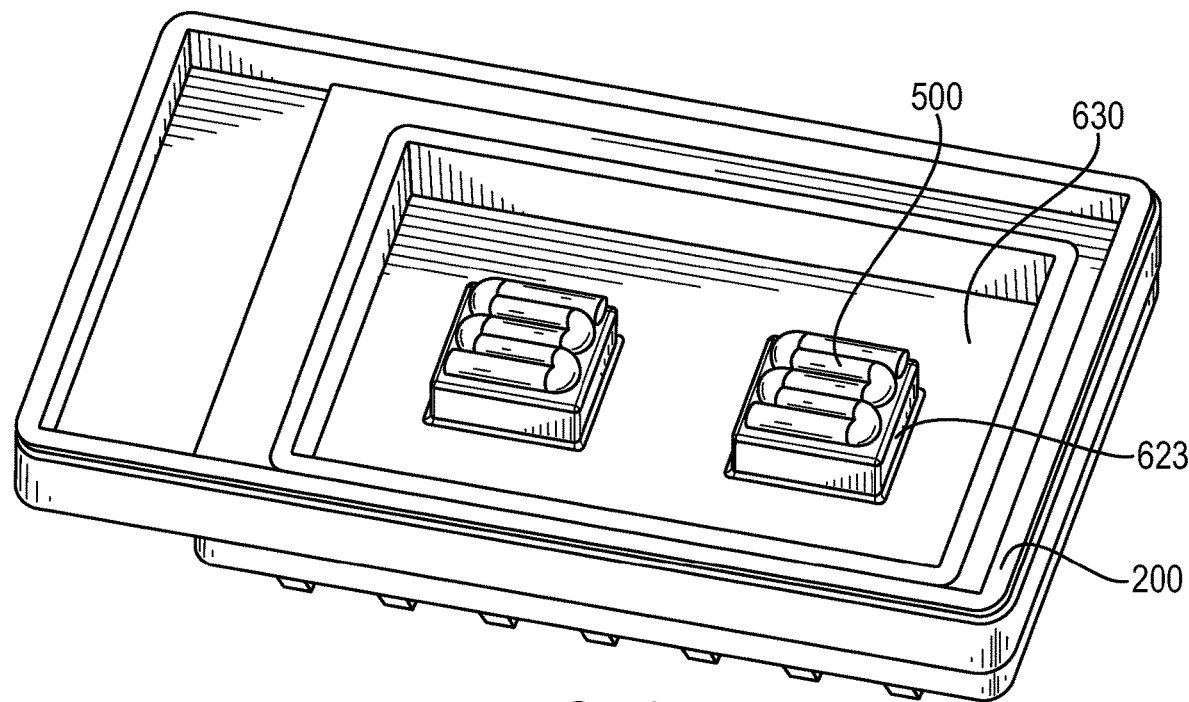
FIG. 25 is a perspective view of the underside of housing assembly of FIG. 19.

As shown in FIG. 25, the housing assembly 600 includes a receiving space 630 for receiving a PCB (not shown). The thermal pads 626 with the TIM 504 applied thereto are positioned to align with and contact heat generating components on the PCB for transferring heat from the heat generating components. The position and size of the thermal pads may be tailored to the particular features of the PCB to be housed within the housing assembly.

Figure 26:
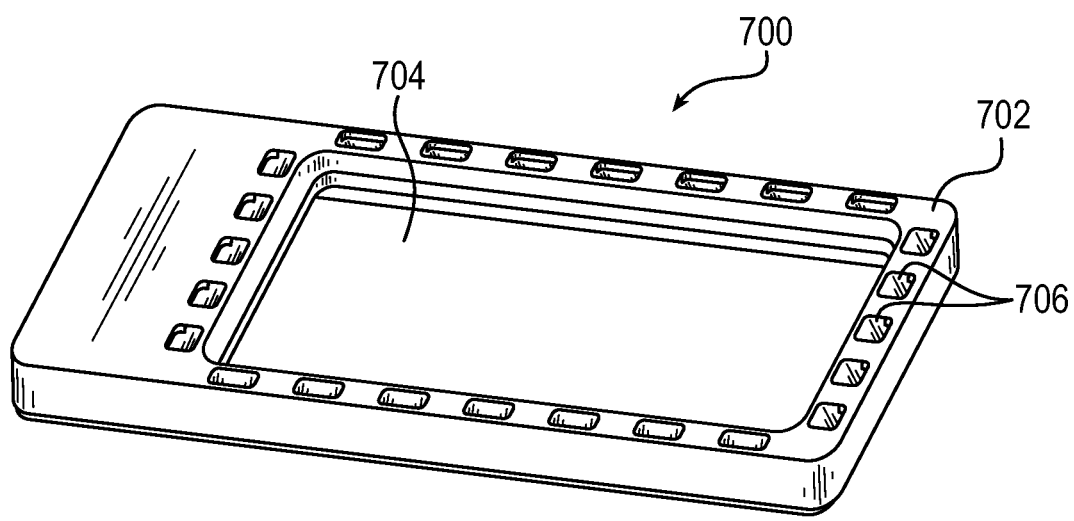
FIG. 26 is a perspective view of the base of an embodiment of the housing assembly in which the base includes a plurality of bores.
Figure 27:
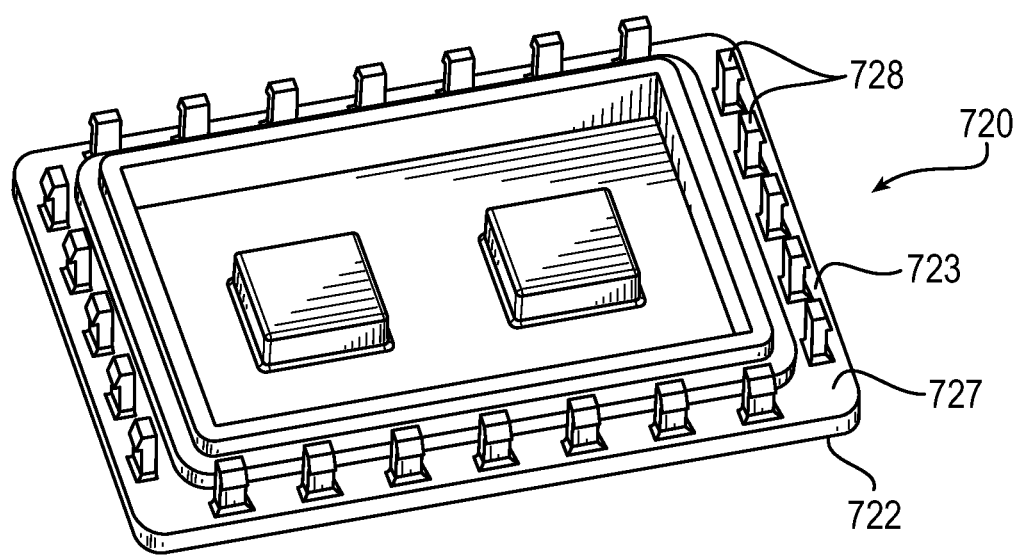
FIG. 27 is a perspective view of the bottom surface of an exemplary heat sink that includes a plurality of resilient tabs that correspond to the plurality of bores of the base of FIG. 26.

In a further embodiment illustrated in FIGS. 26 and 27, the housing base 700 has a top surface 702 that includes a recessed opening 704 and a plurality of bores 706 surrounding the recessed opening 704. The heat sink 720 has a top surface 722 and a bottom surface 723 and an annular retainer lip 727. The annular retainer lip 727 includes a plurality of resilient tabs 728. The plurality of bores 706 of the housing base 700 correspond to the plurality of tabs on the heat sink 720. As previously described, the bores 706 may be of any shape that accommodates the tabs 728 and barbs thereon. The other features of the heat sink and housing base of the electronic housing assembly may be as described above.

As compared to conventional housing assemblies, the electronic housing assembly described herein offers reduced weight and easy installation of the heat sink, and provides a tight environmental seal due the ability to accommodate the different thermal expansion properties of the metal heat sink and plastic housing base.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. An electrical housing assembly comprising:
a housing base having a first opening and an opposing second opening, a recessed flange circumscribing the first opening, and a plurality of resilient retention members surrounding the flange; and
a heat sink positioned over the first opening and having a lip disposed about the periphery of the heat sink and a shoulder disposed radially inward from the lip, the lip having a plurality of bores corresponding to the plurality of resilient retention members for receiving the plurality of resilient retention members therein, wherein the shoulder engages the flange of the housing base in a secured state.

2. The electrical housing assembly of claim 1, wherein the space between the first opening and the opposing second opening defines a receiving cavity for receiving a printed circuit board within the housing assembly.

3. The electrical housing assembly of claim 1, wherein the housing base comprises a polymeric material and the heat sink comprises a metallic material.

4. The electrical housing assembly of claim 3, wherein the heat sink is comprised of aluminum.

5. The electrical housing of claim 1, further comprising an environmental seal member positioned on the heat sink lip, the environmental seal compressed between the lip and the flange in an engaged state.

6. The electrical housing of claim 1, further comprising an elastomeric gasket applied to an inner rim of the heat sink.

7. The electrical housing of claim 6, wherein the elastomeric gasket is electrically conductive.

8. The electrical housing of claim 1, wherein the heat sink includes a plurality of spaced apart cooling fins arranged on an outwardly facing surface of the heat sink.

9. The electrical housing of claim 1, wherein the heat sink includes at least one raised thermal pad at an inwardly facing surface of the heat sink.

10. The electrical housing of claim 9, further comprising a thermal interface material applied to the at least one thermal pad.

11. An electrical housing assembly comprising:
 a housing base having a first opening and an opposing second opening, a recessed flange circumscribing the first opening, and a plurality of bores surrounding the flange; and
 a heat sink positioned over the first opening and having a lip disposed about the periphery of the heat sink and a shoulder disposed radially inward from the lip, the lip having a plurality of resilient retention members,
 wherein the plurality of bores of the housing base are arranged for receiving the plurality of resilient retention members of the heat sink therein, and wherein the shoulder of the heat sink engages the flange of the housing base in a secured state.

12. The electrical housing assembly of claim 11, wherein the space between the first opening and the opposing second opening defines a receiving cavity for receiving a printed circuit board within the housing assembly.

13. The electrical housing assembly of claim 11, wherein the housing base comprises a polymeric material and the heat sink comprises a metallic material.

14. The electrical housing assembly of claim 13, wherein the heat sink is comprised of aluminum.

15. The electrical housing of claim 11, further comprising an environmental seal member positioned on the heat sink lip, the environmental seal compressed between the lip and the flange in an engaged state.

16. The electrical housing of claim 11, further comprising an elastomeric gasket applied to an inner rim of the heat sink.

17. The electrical housing of claim 16, wherein the elastomeric gasket is electrically conductive.

18. The electrical housing of claim 11, wherein the heat sink includes a plurality of spaced apart cooling fins arranged on an outwardly facing surface of the heat sink.

19. The electrical housing of claim 11, wherein the heat sink includes at least one raised thermal pad at an inwardly facing surface of the heat sink.

20. The electrical housing of claim 19, further comprising a thermal interface material applied to the at least one thermal pad.

* * * * *